United States Patent [19]

Kashigi

[11] Patent Number: 4,746,979
[45] Date of Patent: May 24, 1988

[54] VIDEO MEMORY DEVICE CAPABLE OF SIMULTANEOUSLY READING A PLURALITY OF PICTURE ELEMENTS

[75] Inventor: Kazuo Kashigi, Tokyo, Japan
[73] Assignee: NEC Corporation, Japan
[21] Appl. No.: 105,514
[22] Filed: Oct. 2, 1987

Related U.S. Application Data

[63] Continuation of Ser. No. 696,351, Jan. 30, 1985, abandoned.

[30] Foreign Application Priority Data

Jan. 31, 1984 [JP] Japan .................................. 59-16441

[51] Int. Cl.$^4$ .......................... H04N 5/14; H04N 7/14
[52] U.S. Cl. ..................................... 358/134; 358/22; 358/160
[58] Field of Search ............... 358/134, 138, 133, 160, 358/166, 22, 37, 140

[56] References Cited

U.S. PATENT DOCUMENTS

| | | | |
|---|---|---|---|
| 3,366,739 | 1/1968 | Parkinson | 358/134 |
| 4,148,070 | 4/1979 | Taylor | 358/140 |
| 4,292,652 | 9/1981 | Yumde | 358/134 |
| 4,455,572 | 6/1984 | Malden | 358/160 |
| 4,485,402 | 11/1984 | Searby | 358/134 |
| 4,567,506 | 1/1986 | Shinoda | 358/140 |

*Primary Examiner*—Tommy P. Chin
*Attorney, Agent, or Firm*—Ostrolenk, Faber, Gerb & Soffen

[57] ABSTRACT

On achieving a special effect on a television screen, a succession of picture elements is supplied to a video memory device comprising a plurality of memory units which are periodically and successively loaded with the picture elements by a write-in controller during a write-in operation and which are simultaneously accessed by a read-out controller to concurrently read a plurality of the picture elements out of the memory units, respectively. The write-in controller indicates a memory address numbered in common to the memory units until consecutive ones of the picture elements are delivered to all of the memory units and, thereafter, changes the address to another one. The read-out controller simultaneously delivers either a set of common-numbered memory addresses to the respective memory units or a set of the common-numbered memory addresses and adjacent memory addresses to the common-numbered addresses.

4 Claims, 3 Drawing Sheets

VIDEO MEMORY DEVICE CAPABLE OF SIMULTANEOUSLY READING A PLURALITY OF PICTURE ELEMENTS

This is a continuation of application Ser. No. 696,351 filed on Jan. 30, 1985, now abandoned.

BACKGROUND OF THE INVENTION

This invention relates to a video memory device for use in a special effect device which can accomplish a special effect on a television screen by processing a television signal of a succession of picture elements.

A conventional video memory device of the type described can carry out write-in and read-out operations of a succession of picture elements subjected to pulse code modulation (PCM). With the video memory device, it is possible to accomplish various kinds of special effects on a television screen by modifying either one of a write-in speed and a read-out speed from the other. For instance, let the read-out speed be reduced to a half of the write-in speed. In this event, each picture element which is derived from an original image is slowly read out of the video memory device and can form a reproduced image which has twice as wide an area as the original image. However, such a reproduced image inevitably has a degraded picture quality as compared with the original image because each picture element is visually reproduced two times on the reproduced image.

In order to avoid the degradation of picture quality, interpolation is often carried out between two adjacent ones of the picture elements that are derived from the picture element succession. In other words, two adjacent picture elements are necessary for the interpolation. The video memory device is therefore accessed two times on carrying out the interpolation. When all of the picture elements are read out of the video memory device to be reproduced on the television screen, the interpolation can comparatively readily be carried out by the use of the two adjacent picture elements.

However, all of the special effects do not always necessitate reproductions of all picture elements. For example, a certain one of the special effects needs to reproduce intermittent ones of the picture element succession and interpolated picture elements. In order to obtain the interpolated picture elements, two adjacent ones of the picture elements should be read out of the video memory device as mentioned before even when they are not visually displayed on the television screen.

At any rate, the conventional video memory device must sequentially be accessed twice on carrying out the interpolation. Therefore, the interpolation is time-consuming with the conventional video memory device.

SUMMARY OF THE INVENTION

It is an object of this invention to provide a video memory device which is suitable for accomplishing a special effect on a television screen and which can read a plurality of picture elements therefrom at a high speed.

It is another object of this invention to provide a video memory device of the type described, by which interpolation can rapidly be carried out.

It is a further object of this invention to provide a video memory device of the type described, wherein a plurality of picture elements can be read out in response to an indication of a single address.

A video memory device according to this invention is for use in memorizing a succession of picture elements. The video memory device comprises a plurality of memory units, delivering means for successively and periodically delivering the picture elements to the plurality of the memory units by enabling each of the memory unit one at a time, and access means for simultaneously accessing at least two of the memory units to concurrently produce at least two of the picture elements consecutive to one another in the picture element succession from at least two of the memory units.

DESCRIPTION OF THE PREFERRED EMODIMENTS

Figure 1:
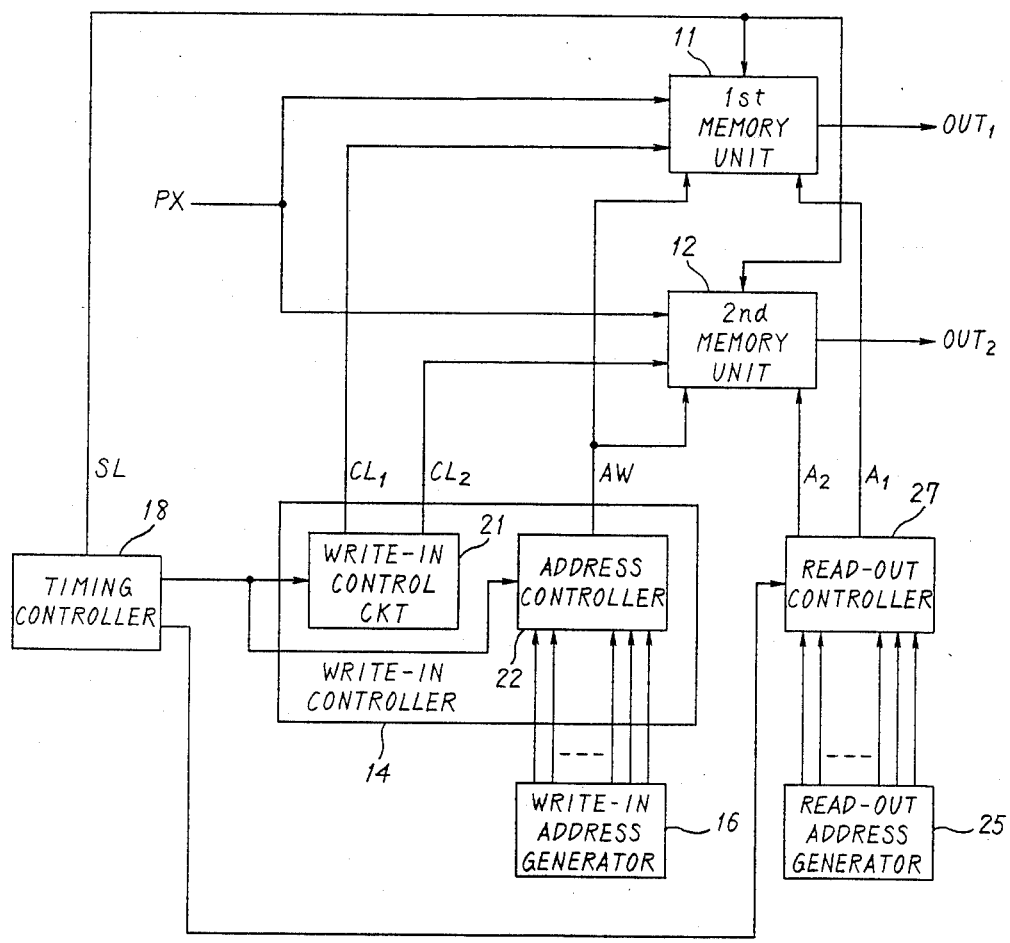
FIG. 1 is a block diagram of a video memory device according to a preferred embodiment of this invention.

Referring to FIG. 1, a video memory device according to an embodiment of this invention is supplied with a succession of picture elements PX. The picture elements PX are subjected to pulse code modulation and time sequentially consecutive to one another. Each picture element specifies a variable and discrete level.

The video memory device comprises a plurality of memory units, p in number, for memorizing the picture element succession. In the example being illustrated, the memory units are equal in number to two and will therefore be called first and second memory units 11 and 12, respectively. Such memory units are under control of a write-in controller 14 on a write-in operation in a manner to be described soon. Each of the first and the second memory units 11 and 12 has the same number of addresses which are for storing the picture elements, respectively. The number of the addresses is assumed to be represented by m. Accordingly, the first and the second memory units 11 and 12 have a total number of the addresses which is represented by 2 m.

The write-in controller 14 is selectively operable in response to write-in address signals which are supplied from a write-in address generator 16. Each of the write-in address signals has a plurality of bits, the number of which is selected so that the total number 2 m of the addresses of the first and the second memory units 11 and 12 can be accessed. The write-in controller 14 is put into operation by a timing controller 18 to access the first and the second memory units 11 and 12 in a manner to be described later.

The timing controller 18 delivers a sequence of clock pulses to the write-in controller 14 during a write-in operation. A write-in control circuit 21 of the write-in controller 14 selectively produces first and second control signals $CL_1$ and $CL_2$ in response to the clock pulses. In the example being illustrated, the first and the second control signals $CL_1$ and $CL_2$ are alternatingly sent to the first and the second memory units 11 and 12 at every other clock pulse. Accordingly, the write-in control circuit 21 may be either a binary counter or a flip flop.

In addition, the timing controller 18 produces another sequence of clock pulses during a read-out operation which will later be described in detail. A selection signal SL is also produced from the timing controller 18 so as to indicate whichever of the write-in and the read-out operations in a manner known in the art.

The write-in controller 14 comprises an address controller 22 connected to the timing controller 18 and the write address generator 16, as illustrated in FIG. 1. With this structure, the address controller 22 is supplied with the clock pulses and the write-in address signals from both of the timing controller 18 and the write-in address generator 16, respectively. The address controller 22 produces a write-in memory address signal AW responsive to each of the write-in address signals. The write-in memory address signal AW is supplied to the first and the second memory units 11 and 12 in common. Operation of the address controller 21 will become clear as the description proceeds.

Figure 2:
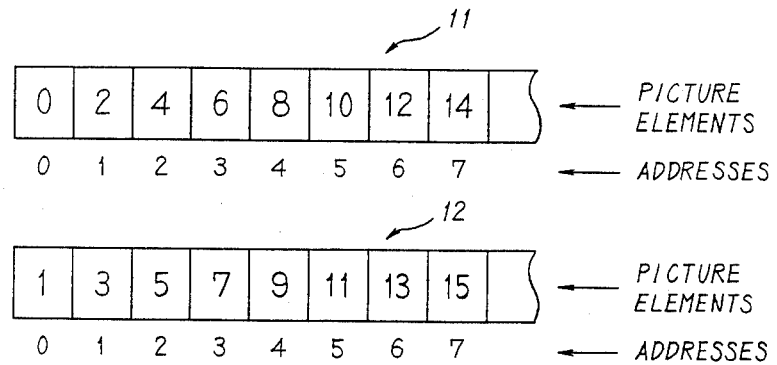
FIG. 2 is a partial view of memory units for use in describing a write-in operation of the video memory device illustrated in FIG. 1.

Referring to FIG. 2 together with FIG. 1, the first and the second memory units 11 and 12 are partially illustrated in FIG. 2 and comprise the memory addresses which are consecutively numbered from zero to seven, respectively, and which will be called zeroth through seventh addresses, respectively. Let the picture element succession have the picture elements consecutively numbered from zero to fifteen. In this event, the picture elements from zero to fifteen may be called zeroth through fifteenth elements, respectively. Inasmuch as the zeroth through fifteenth elements are alternatingly delivered to the first and the second memory units 11 and 12 in accordance with the first and the second control signals $CL_1$ and $CL_2$ in the above-mentioned manner, the first memory unit 11 is loaded in the zeroth through seventh addresses thereof with even numbered ones of the zeroth through fifteenth elements while the second memory unit 12 is loaded in the zeroth through seventh addresses with odd numbered ones of the elements, as illustrated in FIG. 2.

It is to be noted here that each of the write-in address signals is increased by one each time when two of the picture elements are memorized in the same addresses of the first and the second memory units 11 and 12. Thus, the write-in controller 14 serves to deliver the picture elements to the first and the second memory units 11 and 12.

Referring back to FIG. 1, the video memory device further comprises a read-out address generator 25 operable during a read-out operation so as to selectively generate read-out address signals in a manner similar to the write-in address generator 16. Accordingly, the read-out address signals and bits of the read-out address signals may be referred to as primary address signals and the primary address bits, respectively. The read-out address signals are similar to the write-in addresses and sent from the read-out address generator 25 to a read-out controller 27 which will be described later in detail.

Figure 3:
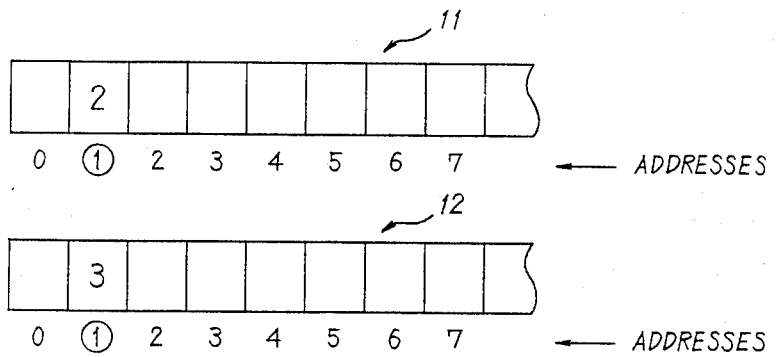
FIG. 3 is a similar view for use in describing a read-out operation of the video memory device illustrated in FIG. 1.
Figure 4:
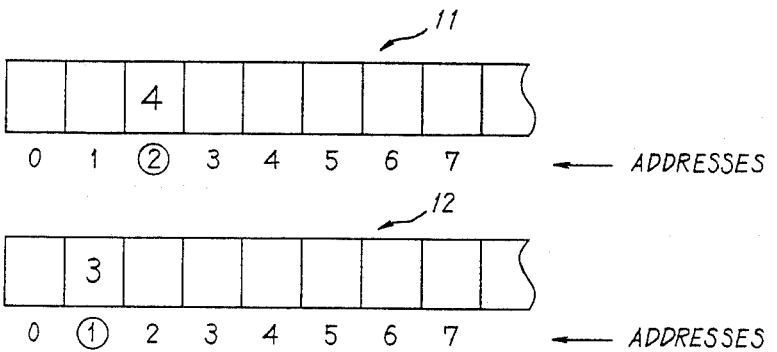
FIG. 4 is a similar view for use in describing another read-out operation of the video memory device illustrated in FIG. 1.

Referring to FIGS. 3 and 4 together with FIG. 1, description will be made as regards interpolation which can be carried out by the use of the illustrated video memory device. It is assumed that the first and the second memory units 11 and 12 are already loaded with the zeroth through fifteenth elements in the manner illustrated in FIG. 2 by the use of the write-in controller 14. In FIG. 3, let interpolation be carried out to obtain an intermediate element between the second and the third elements represented by 2 and 3. The intermediate element may be called a first or two and a half intermediate element (2.5). The remaining elements are omitted from this figure merely for simplicity of description. In order to carry out the above-mentioned interpolation, the first addresses represented by the encircled 1 may simultaneously be accessed in the first and the second memory units 11 and 12 by the read-out controller 27 to read the second and the third elements 2 and 3, respectively.

In FIG. 4, let interpolation be carried out so as to attain another intermediate element which appears between the third and the fourth elements 3 and 4 and which may be called a second or three and a half intermediate element (3.5). Inasmuch as the third and the fourth elements 3 and 4 are memorized in the first address of the second memory unit 12 and the second address of the first memory unit 11, respectively, the read-out controller 27 (FIG. 1) may access the first address of the second memory unit 12 and the second address of the first memory unit 11.

At any rate, two adjacent elements necessary for interpolation are stored in different memory units. This means that the first and the second memory units 11 and 12 may simultaneously be accessed during read-out operation to derive two adjacent elements therefrom. In addition, the two adjacent elements are stored either in the same addresses of the first and the second memory units 11 and 12 or in a certain address of the second memory unit 12 and the following address of the first memory unit 11.

Each of the read-out address signals has a predetermined number q of bits arranged from the most significant bit to the least significant bit. It is presumed that the least significant bit of each read-out address signal is for use in selecting either one of the first and the second memory units 11 and 12 and is indicative of the first and the second memory units 11 and 12 when it takes the values "0" and "1", respectively. In the example being illustrated, the first and the second memory units 11 and 12 are spatially divided from each other and may individually be accessed through different paths. Accordingly, each address of both of the first and the second memory units 11 and 12 can be specified by the bits of each read-out address signal except the least significant bit. In other words, the least significant bit of each read-out address signal may be omitted from each read-out address signal to distinguish between the first and the second memory units 11 and 12.

Under the circumstances, it is possible to simultaneously indicate two addresses different from each other in response to each read-out address signal by modifying the least significant bit of each read-out address signal.

As described in conjunction with FIGS. 3 and 4, the two adjacent addresses necessary for interpolation are either a pair of the same addresses or a pair of addresses different from each other by one.

Figure 5:
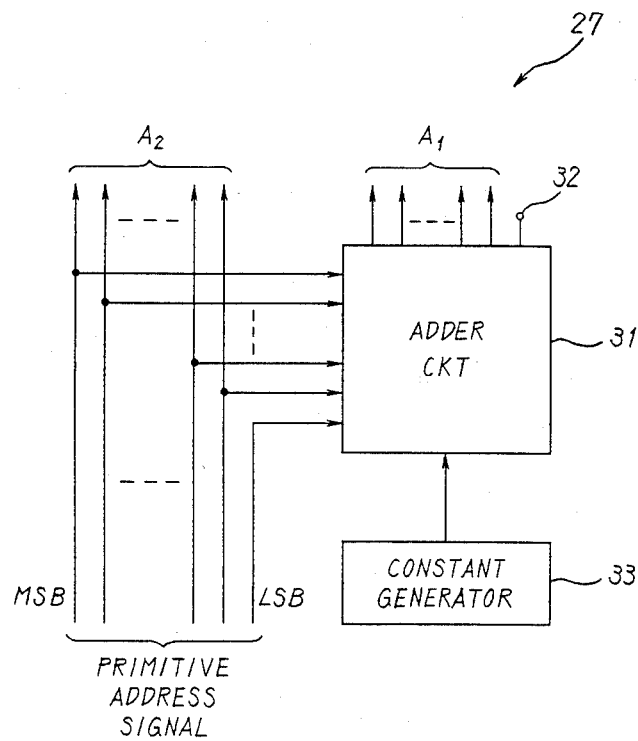
FIG. 5 is a block diagram of a part of the video memory device illustrated in FIG. 1.

Referring to FIG. 5 together with FIG. 1, the read-out controller 27 is supplied with each of the read-out address signals which will be called the primary address signal. The primary address signal is sent to an adder circuit 31 to be processed in a manner to presently be described into a first memory address signal $A_1$ for use in selectively specifying the memory addresses of the first memory unit 11 (FIG. 1).

The first address signal $A_1$ may specify either a memory address indicated by the primary address bits except the least significant bit or another memory address different by one from that indicated by the primary address bits except the least significant bit, as mentioned before.

It is to be noted that another memory address is accessed when the primary address signal selects the second memory unit 12, namely, the least significant bit takes the logic "1" level.

In FIG. 5, the adder circuit 31 is supplied as a first input signal X with the primary address signal including the least significant bit. In addition, a second input signal Y is supplied from a signal generator (not shown) to the adder circuit 31 so as to add unity to the least significant bit of the primitive address signal. The adder circuit 31 produces a result signal representative of a result of addition having the same number q of bits as the primary address signal. The result signal is produced as the first memory address signal $A_1$ with the least significant bit of the result omitted, as suggested by a terminal 32 in FIG. 5. Therefore, the terminal 32 serves to remove the least significant bit from the result of addition.

On the other hand, the primary address signal is produced as a second memory address signal $A_2$ through a wiring of the read-out controller 27 with the least significant bit omitted therefrom. Thus, the circuitry may be referred to as a coupling circuit for coupling a selected part of each primary address signal to the second memory unit 12 $A_2$ selectively specifies the memory addresses of the second memory unit 12.

Let the first intermediate element (2.5) be interpolated between the second and the third elements 2 and 3, as shown in FIG. 3. In this event, let four less significant bits of the primary address signal take a pattern of "0010" to specify the first address of the first memory unit 11. The read-out controller 27 supplies the second memory unit 12 as the second memory address signal with the primary address bits except the least significant bit "0." As a result, three upper bits of the four less significant bits are selected by the wiring of the read-out controller 27. Therefore, three less significant bits of the second memory address signal take a pattern of "001" and specify the first address of the second memory unit 12.

Meanwhile, the adder circuit 31 is supplied as the second input signal with a constant value of unity from a constant generator 33 and adds the pattern of "0010" to unity to get the result signal of "0011." As mentioned above, the three upper bits ("001") of the result signal are sent as the first memory address signal $A_1$ to the first memory unit 11 with the least significant bit "1" of the result omitted. Thus, the first memory address signal of "001" specifies the first address of the first memory unit 11.

Consequently, the first addresses of the first and the second memory units 11 and 12 are simultaneously accessed by the first and the second memory address signals $A_1$ and $A_2$ to read the second and the third elements 2 and 3 therefrom. The second and the third elements 2 and 3 are concurrently sent as first and second output signals $OUT_1$ and $OUT_2$ to an interpolator (not shown). The interpolator can readily reproduce the first intermediate element (2.5) in response to both of the first and the second output signals $OUT_1$ and $OUT_2$ (FIG. 1).

Next, let the second intermediate element (3.5) be interpolated between the third and the fourth elements 3 and 4, as illustrated in FIG. 4. The read-out address generator 25 supplies the read-out controller 27 with a particular one of the primary address signals specifying the first address of the second memory unit 12. Therefore, the four less significant bits of the particular address signal have a pattern of "0011." In this event, only three upper bits "001" of the four less significant bits are sent to the second memory unit 12 as the second address signal with the least significant bit "1" omitted.

On the other hand, the particular address signal is supplied to the adder circuit 31. The adder circuit 31 adds the least significant bit "1" of the particular address signal to the second input signal to produce the result signal representative of a result having four less significant bits of "0100."

The result signal is sent from the adder circuit 31 to the first memory unit 11 as the first memory address signal $A_1$ after the least significant bit is omitted from the first memory address $A_1$. The adder circuit 31 is operable to produce the first memory address signal $A_1$ in response to the each primary address signal. In this event, the three less significant bits of the first memory address signal $A_1$ take a pattern of "010" which specifies the second address of the first memory unit 11.

Thus, the second address of the first memory unit 11 is accessed by the read-out controller 27 together or concurrently with the first address of the second memory unit 12. As a result, the third and the fourth elements 3 and 4 are simultaneously supplied to the interpolator.

As readily understood from the above, the address controller 22 can also produce the write-in memory address signals by omitting the least significant bit from each primary address signal in the manner described in conjunction with the read-out controller 27.

While this invention has thus far been described in conjunction with a preferred embodiment thereof, it will readily be possible for those skilled in the art to put this invention into practice in various other manners. For example, the number of the memory units may be greater than two. Preferably, the memory units may be equal in number to $2^n$ where n is a natural number and simultaneously accessed so as to simultaneously read the picture elements of $2^n$ out of the memory units of $2^n$, respectively. In this event, each primary address signal is sent to a set of adder circuits which are equal in number to $2^n-1$ and which are supplied with the second input signals representative of unity through $2^n-1$ from the constant generator 33, respectively. Each memory address signal has the number of bits equal to a difference between the number q of the primary address bits and the natural number n. The memory units are periodically supplied with the picture elements to be stored therein on a write-in operation, respectively, and simultaneously accessed to produce a plurality of the picture elements, $2^n$ in number, on a read-out operation.

What is claimed is:

1. A video memory device for storing a succession of picture elements, said video memory device comprising
   a plurality of memroy units,
   input delivering means for successively delivering said picture elements to said plurality of memory units
   means for enabling each of said memory units one at a time to sotre successive said picture elements in different ones of said memory units, and
   access means for simultaneously accessing at least two of said memory units to concurrently produce at least two of the picture elements consecutive to one another in said succession of picture elements from said at least two of said memory units.

2. A video memory device as claimed in claim 1, each of said memory units having a plurality of memory addresses, wherein said access means comprises:
   address producing means for selectively producing primary address signals by which all said memory addresses of said plurality of the memory units are accessible;
   address processing means coupled to said address producing means for processing each of said primary address signals into at least two of memory address signals by which the memory addresses of each of said memory units are accessible; and
   address delivering means for simultaneously delivering said at least two memory address signals to said at least two memory units to make said at least two memory units concurrently produce said at least two picture elements, respectively.

3. A video memory device as claimed in claim 2, wherein said address processing means comprises:
   coupling means for coupling said address producing means to said address delivering means to produce a part of said each primary address as a prescribed one of said at least two memory address signals;
   constant value generating means for producing a constant value signal representative of at least one predetermined constant value; and
   address signal producing means responsive to said each primary address signal and said constant value signal for producing the remaining one of said at least two memory address signals.

4. A video memory device as claimed in claim 3, wherein said address signal producing means comprises:
   adder means for adding said each primary address signal to said constant value signal to produce a resultant signal which has a most significant bit and a least significant bit; and
   an address terminal set for producing the remaining one of said at least two memory address signals by omitting said least significant bit from said result signal.

* * * * *